(12) United States Patent
Kwon

(10) Patent No.: US 10,798,853 B2
(45) Date of Patent: Oct. 6, 2020

(54) INVERTER DEVICE TO ACHIEVE IMPROVED HEAT DISSIPATION EFFICIENCY

(71) Applicant: LSIS CO., LTD., Anyang-si, Gyeonggi-do (KR)

(72) Inventor: Hyuk-Il Kwon, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 16/489,852

(22) PCT Filed: Aug. 24, 2017

(86) PCT No.: PCT/KR2017/009279
§ 371 (c)(1),
(2) Date: Aug. 29, 2019

(87) PCT Pub. No.: WO2018/159911
PCT Pub. Date: Sep. 7, 2018

(65) Prior Publication Data
US 2020/0008324 A1   Jan. 2, 2020

(30) Foreign Application Priority Data

Mar. 3, 2017   (KR) ........................ 10-2017-0027508

(51) Int. Cl.
*H05K 7/20*       (2006.01)
*H01R 9/24*       (2006.01)
(Continued)

(52) U.S. Cl.
CPC ....... *H05K 7/20909* (2013.01); *H01R 9/2416* (2013.01); *H02M 7/003* (2013.01);
(Continued)

(58) Field of Classification Search
CPC .......... H05K 7/20136; H05K 7/20172; H05K 7/2089; H05K 7/20909–20918;
(Continued)

(56) References Cited

U.S. PATENT DOCUMENTS 4,459,638 A * 7/1984 Brehm ............... H05K 7/20909
                                                  361/697
5,424,915 A   6/1995 Katooka et al.
(Continued)

FOREIGN PATENT DOCUMENTS

CN          2426645 Y     4/2001
CN          2749090 Y     12/2005
(Continued)

OTHER PUBLICATIONS

International Search Report for related International Application No. PCT/KR2017/009279 report dated Sep. 7, 2018; (3 pages).
(Continued)

*Primary Examiner* — Zachary Pape
(74) *Attorney, Agent, or Firm* — K&L Gates LLP

(57) ABSTRACT

The present invention relates to an inverter device having an inverter module for converting DC power stored in an energy storage system (ESS) of a photovoltaic power generation system into AC power and supplying the AC power to a load. The inverter device comprises a case, an input/output terminal unit, and a heat dissipating fan. The case has an inverter module housed therein and a plurality of heat dissipating holes formed on the rear surface thereof. The input/output terminal unit is fixed to an upper portion of the front surface of the case through a first fastening member, and a plurality of cables are connected to an inner surface thereof through a second fastening member so as to be energized. The heat dissipating fan is fixed to the front surface of the case while being disposed below the input/

(Continued)

output terminal unit, and discharges heat generated by the inverter module.

10 Claims, 7 Drawing Sheets

(51) Int. Cl.
  *H02M 7/00* (2006.01)
  *H02M 7/44* (2006.01)
  *H05K 5/02* (2006.01)

(52) U.S. Cl.
  CPC ............ *H02M 7/44* (2013.01); *H05K 5/0247* (2013.01); *H05K 7/20145* (2013.01); *H05K 7/20172* (2013.01)

(58) Field of Classification Search
  CPC ... H05K 5/0247; H01R 9/2416; H02M 7/003; H02M 7/44
  See application file for complete search history.

(56) References Cited

U.S. PATENT DOCUMENTS

| | | | | |
|---|---|---|---|---|
| 6,224,430 B1* | 5/2001 | Kusuda | ................ | H01R 12/515 439/709 |
| 7,205,740 B1* | 4/2007 | Wei | ....................... | F04D 25/166 318/434 |
| 7,773,369 B2* | 8/2010 | Dornauer | ................... | H02P 1/04 318/370 |
| 8,488,319 B2* | 7/2013 | Santos | .................. | H02M 7/003 361/695 |
| 9,831,571 B2* | 11/2017 | Kaneoya | .................. | H01R 9/26 |
| 10,314,211 B2* | 6/2019 | Kim | .................... | H05K 7/20909 |
| 2009/0268405 A1* | 10/2009 | Kaveh | ................ | H05K 7/20918 361/697 |
| 2011/0122669 A1 | 5/2011 | Santos | | |

FOREIGN PATENT DOCUMENTS

| | | |
|---|---|---|
| CN | 2547034 Y | 4/2006 |
| CN | 102498651 A | 6/2012 |
| CN | 102904469 A | 1/2013 |
| CN | 203056990 U | 7/2013 |
| CN | 103269168 A | 8/2013 |
| CN | 203423265 U | 2/2014 |
| CN | 203645555 U | 6/2014 |
| CN | 203800276 U | 8/2014 |
| CN | 204794653 U | 11/2015 |
| GB | 765965 A | 1/1957 |
| JP | H06245525 A | 9/1994 |
| JP | H07254447 A | 10/1995 |
| KR | 101004732 B1 | 1/2011 |
| KR | 101187260 B1 | 10/2012 |
| KR | 20130001064 A | 1/2013 |
| KR | 20150017080 A | 2/2015 |
| KR | 20160069367 A | 6/2016 |

OTHER PUBLICATIONS

Written Opinion for related International Application No. PCT/KR2017/009279; report dated Sep. 7, 2018; (4 pages).
Chinese Office Action for related Chinese Application No. 201780087755.1; action dated Jun. 1, 2020; (6 pages).
Chinese Office Action for related Chinese Application No. 201780087755.1; action dated Mar. 12, 2020; (9 pages).

* cited by examiner

[FIG. 1]
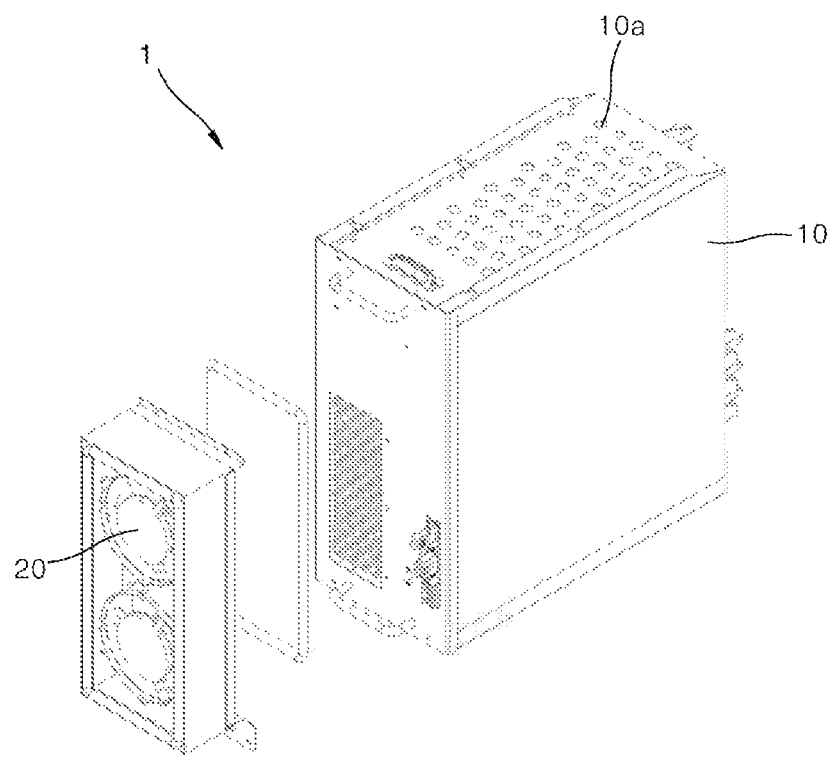
(PRIOR ART)

[FIG. 2]
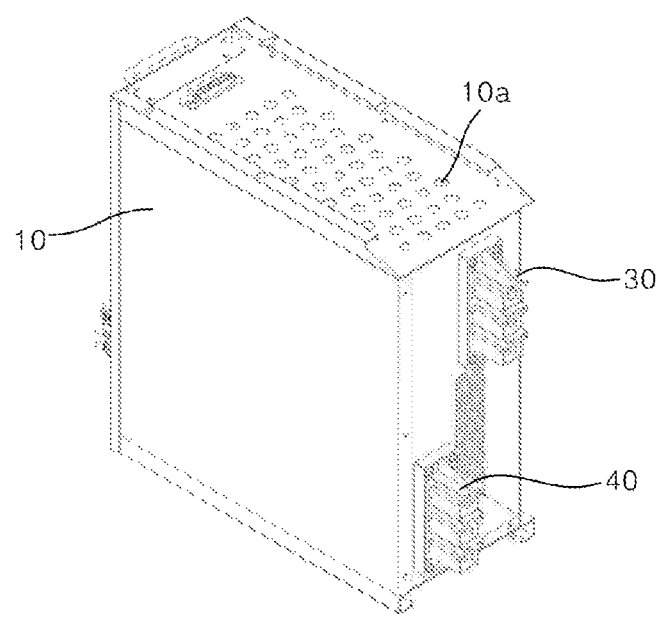
(PRIOR ART)

[FIG. 3]
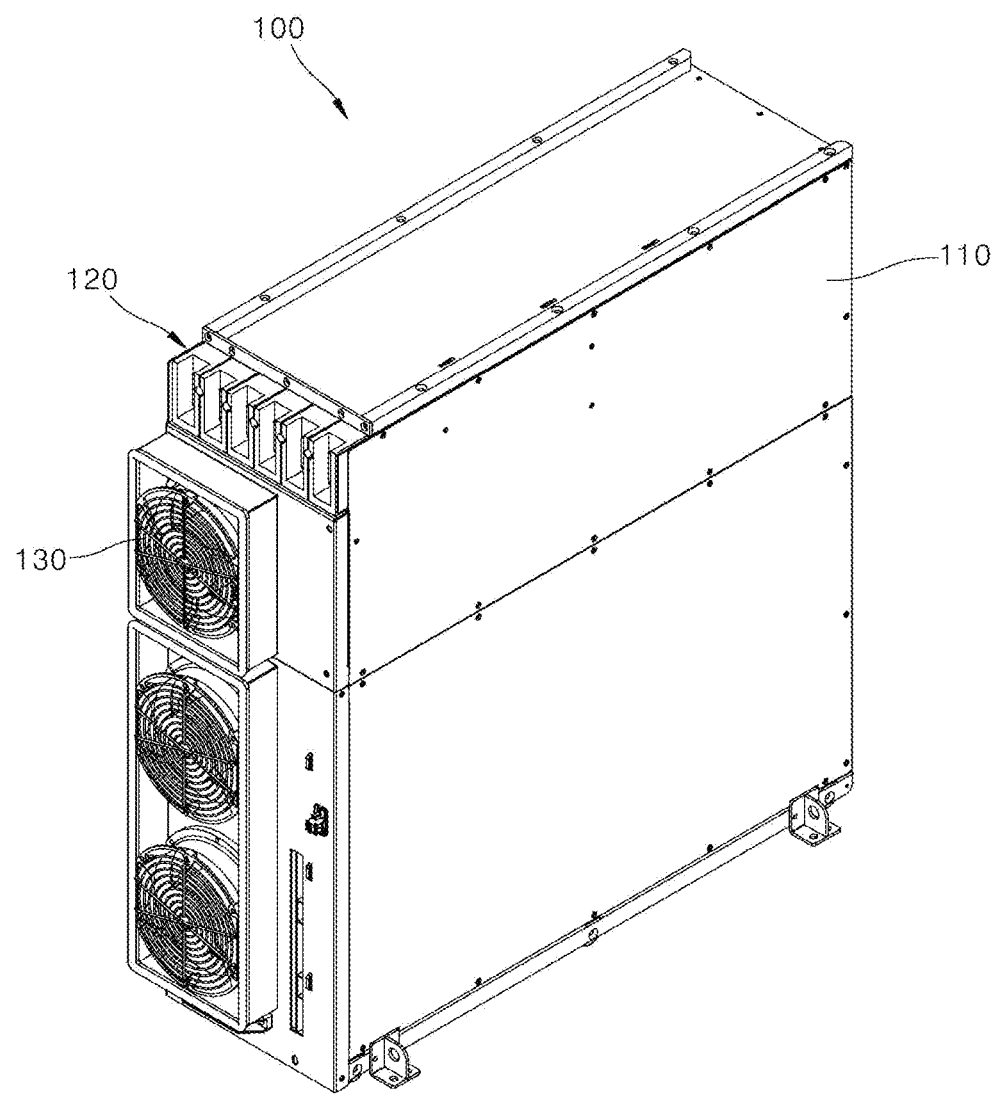

[FIG. 4]
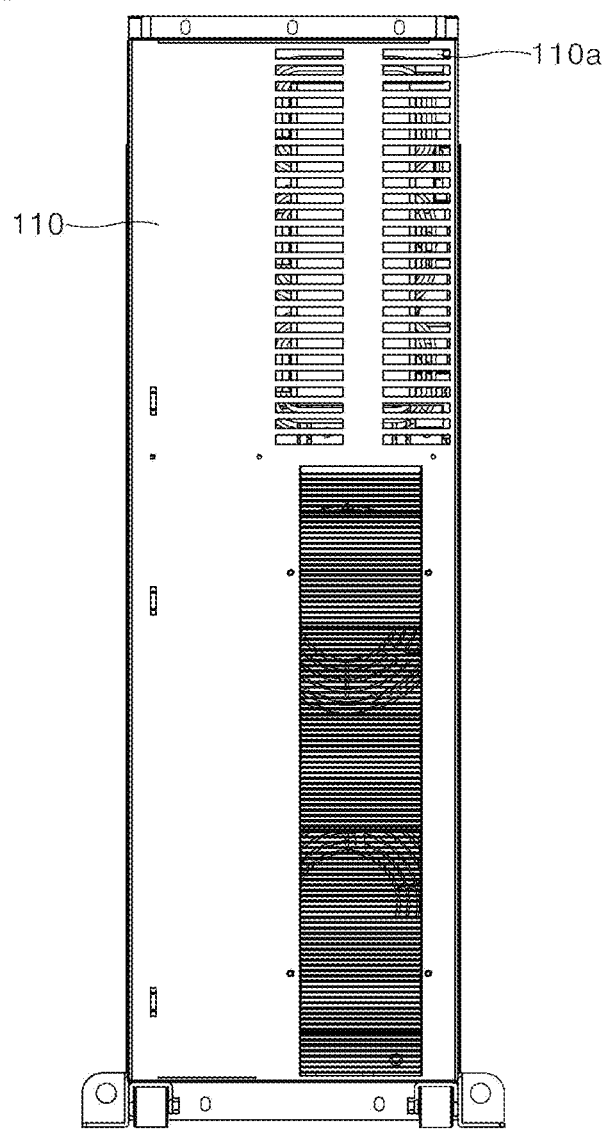

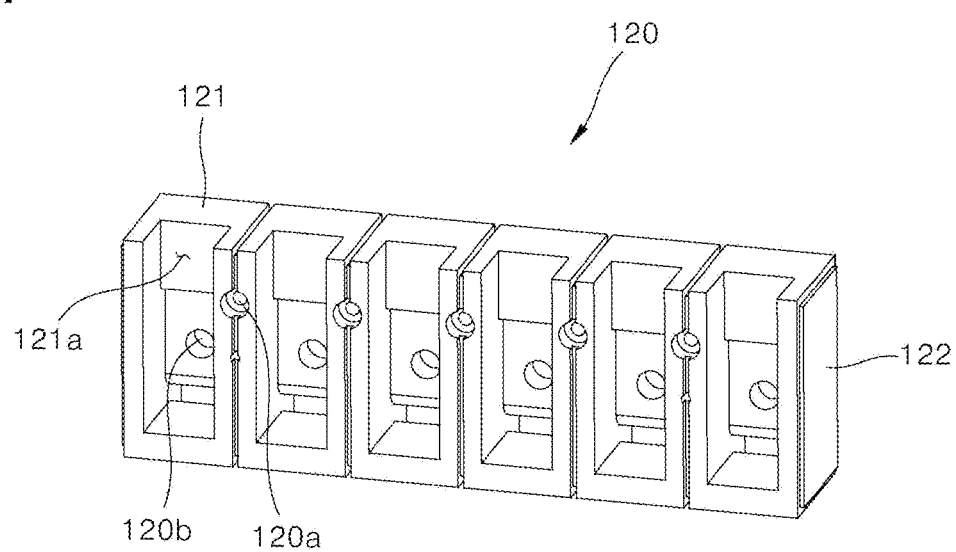
[FIG. 5]

[FIG. 6]
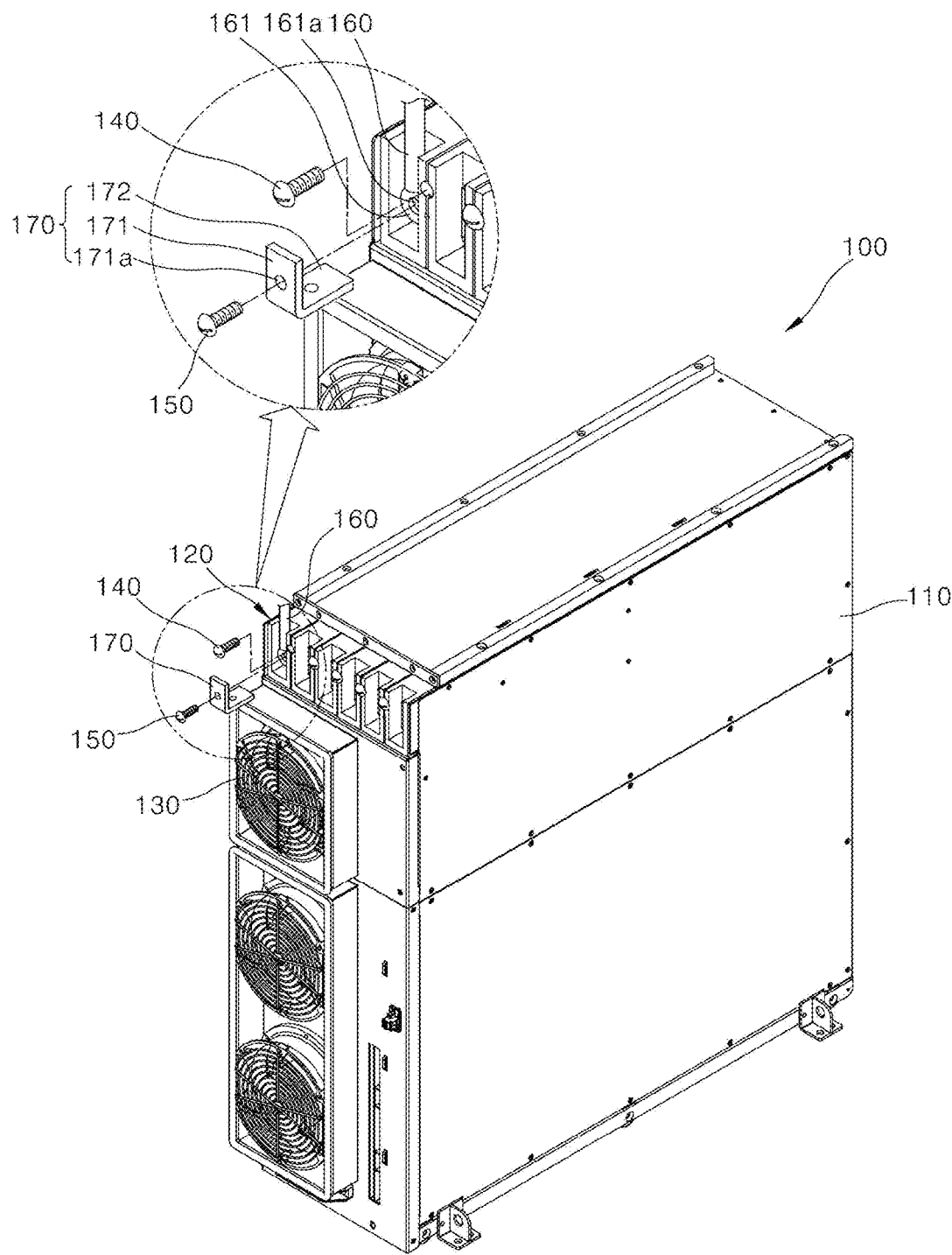

[FIG. 7]
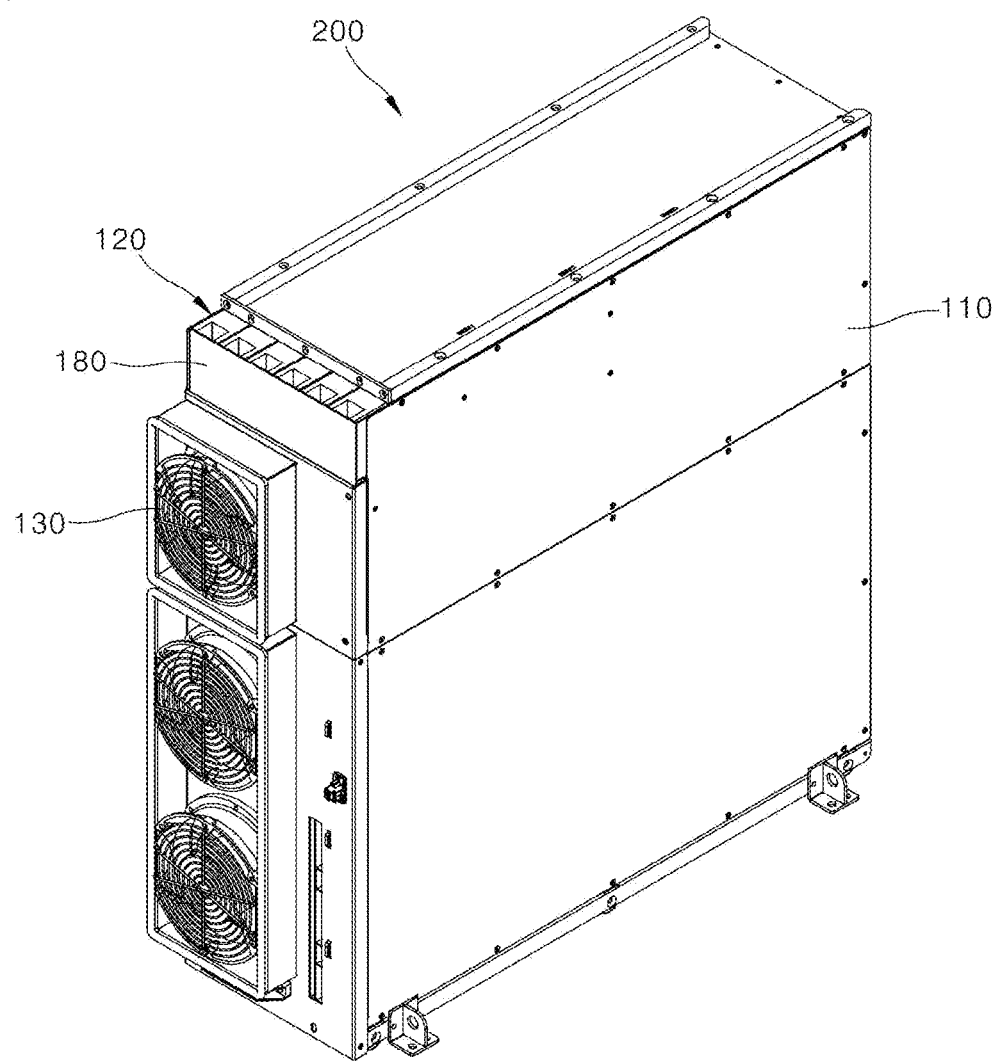

INVERTER DEVICE TO ACHIEVE IMPROVED HEAT DISSIPATION EFFICIENCY

CROSS-REFERENCE TO RELATED APPLICATIONS

The present application is a National Stage of International Application No. PCT/KR2017/009279, filed Aug. 24, 2017, which claims priority to Korean Application No. 10-2017-0027508 filed on Mar. 3, 2017, the disclosure of which are incorporated herein by reference.

TECHNICAL FIELD

The present disclosure relates to an inverter device that converts DC power stored in an energy storage system (ESS) of a photovoltaic power generation system into AC power and supplies the AC power to a load.

DESCRIPTION OF RELATED ART

In recent years, excessive fossil energy consumption leads to fossil energy depletion, and environmental problems. Thus, research and interest in renewable energy has been focused.

Therefore, a variety of new renewable energy have been developed and utilized practically. Among them, photovoltaic power generation is one of the most popular energy sources.

The photovoltaic power generation system is composed of an inverter device for converting DC power obtained from an energy source into AC power, and equipment for supplying the AC output of the inverter device to a system or load.

In this connection, a DC input terminal of the inverter device may be normally connected to a battery or energy storage system (ESS). An AC output terminal thereof may be connected to devices such as a filter and a transformer for stable power supply.

In one example, FIG. 1 is a front exploded perspective view showing an inverter device according to a prior art. FIG. 2 is a back view of the inverter device shown in FIG. 1. A conventional inverter device will be described with reference to FIGS. 1 to 2.

As shown in FIG. 1 to FIG. 2, the conventional inverter device 1 includes a casing 10 in which an inverter module is housed, a heat dissipation fan 20 installed on a front surface of the casing 10, a DC input terminal 30 and an AC output terminal 40 installed on a rear surface of the casing 10.

In this structure, the DC input terminal 30 and the AC output terminal 40 are provided on the rear surface of the casing 10. Thus, it is difficult to replace the DC input terminal 30 and the AC output terminal 40 when they are damaged.

Further, since the DC input terminal 30 and the AC output terminal 40 are provided on the rear surface of the casing 10, heat dissipating holes 10a must be formed in a top of the casing 10 in order to secure an installation space.

However, since the heat radiating fan 20 is disposed on the front surface of the casing 10, air introduced by the heat radiating fan 20 moves from a front to a rear of the casing 10 therein. In this connection, since the heat dissipating holes 10a are disposed on the top of the casing 10, heat exchanged air is not smoothly discharged to an outside of the casing 10.

In addition, since a cable is inserted into the DC input terminal 30 and the AC output terminal 40, foreign substances may be attached to the DC input terminal 30 and the AC output terminal 40 or an external force may be applied thereto. Thus, contact failures of the DC input terminal 30 and the AC output terminal 40 may occur.

DISCLOSURE

Technical Purposes

A purpose of the present disclosure is to provide an inverter device in which input/output terminal unit and a heat dissipation fan are disposed on a front face of the casing in an exposed manner to an outside such that maintenance thereof is easy, and a heat dissipation fan and heat dissipation holes face each other to achieve improved heat dissipation efficiency.

Technical Solution

An inverter device according to the present disclosure for achieving the purpose includes an inverter module for converting DC power into AC power and supplying the AC power to a load, and includes a casing, input/output terminal unit, and a heat dissipation fan. The casing houses the inverter module. A plurality of heat dissipation holes are formed on a rear surface of the casing. The input/output terminal unit is fastened to a top of a front face of the casing using first fasteners. A plurality of cables are electrically connected to the input/output terminal unit at an inner face thereof using second fasteners. The heat dissipation fan is disposed below the input/output terminal unit and is fixed to a front face of the casing. Heat generated by the inverter module is dissipated out of the casing using the heat dissipation holes.

Technical Effects

According to the present disclosure, the input/output terminal unit and heat dissipation fans are installed on the front face of the casing in an exposed manner to the outside to facilitate maintenance and repair of the input/output terminal unit and heat dissipation fans.

Further, the heat dissipation fan is arranged to face the heat dissipation holes such that air heat exchanged with the inverter module can be directly discharged to the outside to improve the heat dissipation efficiency.

Further, since the cables are fixed to the input/output terminal unit via the fasteners, thereby to disallow foreign matter to attach to the terminals or to disallow the cables to be removed from the input/output terminal unit, which may occur otherwise due to external forces.

In addition, since the input/output terminal unit is composed of a plurality of terminal blocks which are fastened to the casing using the fasteners, the terminal blocks may be prevented from being separated from the casing. Therefore, when the input/output terminal unit is damaged, the fasteners are removed such that only the damaged terminal block is replaced. Thus, the replacement cost can be reduced.

BRIEF DESCRIPTION OF THE DRAWINGS

FIG. 1 is a front perspective view of an inverter device according to the prior art.

FIG. 2 is a perspective view of a back of the inverter device shown in FIG. 1.

FIG. 3 is a perspective view of an inverter device according to one embodiment of the present disclosure.

FIG. 4 shows a back view of the inverter device shown in FIG. 3.

FIG. 5 is a perspective view of an input/output unit shown in FIG. 3.

FIG. 6 shows cables and bus bars mounted on the inverter device shown in FIG. 3.

FIG. 7 is a perspective view of an inverter device according to another embodiment in FIG. 3.

DETAILED DESCRIPTION

Hereinafter, an inverter device according to a preferred embodiment of the present invention will be described in detail with reference to the accompanying drawings. In this connection, the same reference numerals are used for the same components. A detailed description of known functions and constructions which may unnecessarily obscure gist of the present disclosure will be omitted. Embodiments of the present disclosure are provided to more fully describe the present disclosure to those of ordinary skill in the art. Accordingly, a shape and size of each of elements in the figures may be exaggerated for clarity.

FIG. 3 is a perspective view of an inverter device according to one embodiment of the present disclosure. FIG. 4 shows a back view of the inverter device shown in FIG. 3. FIG. 5 is a perspective view of an input/output unit shown in FIG. 3. FIG. 6 shows cables and bus bars mounted on the inverter device shown in FIG. 3. FIG. 7 is a perspective view of an inverter device according to another embodiment in FIG. 3.

As shown in FIGS. 3 to 6, the inverter device 100 includes a casing 110, an input/output terminal unit 120, and a heat dissipation fan 130. In this connection, the inverter device 100 uses the inverter module connected to the ESS (Energy Storage System) including solar collectors to converts DC power of the energy storage system into AC power and supplies the AC power to a load.

The casing 110 houses the inverter module. In this connection, the inverter module may include a resistor, a fuse, a switching element that converts DC into AC, a CT (current transducer) that detects output current, and a snubber that suppresses a spike type voltage that occurs during switching. Since the construction and operation of the inverter module are well-known, a detailed description thereof will be omitted.

As the inverter module includes various heat generating elements, a plurality of heat dissipation holes 110a may be formed on a rear surface of the casing 110 to discharge the heat generated from the inverter module to the outside.

The heat dissipation holes 110a may be defined for discharging the heat generated from the inverter module to the outside and may be formed by drilling the rear surface of the casing 110. The heat dissipation holes 110a may be spaced apart from each other in the longitudinal direction of the casing 110 and may be implemented in various forms.

The input/output terminal unit 120 is secured to the top of the front face of the casing 110 using first fasteners 140.

To this end, each first fastening hole 120a may be formed in one face of the input/output terminal unit 120. Each second fastening hole (not shown) may be formed in the front face of the casing 110 at a position corresponding to each first fastening hole 120a. Accordingly, when each first fastener 140 is inserted into each first fastening hole 120a and each second fastening hole (not shown) and then rotated in a fastening direction, the input/output terminal unit 120 may be fixed to the front face of the casing 110.

A plurality of cables 160 may be electrically coupled to the input/output terminal unit 120 on an inner face thereof using second fasteners 150. In this connection, the cables 160 may include an input cable and an output cable. A terminal 161 may be disposed at an end of each cable 160. In this connection, the terminal 161 of the cable 160 may have a circular ring shape having a through hole 161a formed at a center thereof.

Specifically, the input/output terminal unit 120 is open at a front and a top thereof. the input/output terminal unit 120 may have a plurality of terminal blocks 121 having slots 121a formed therein respectively.

An insulating member 122 may be provided on a lateral face of each terminal block 121 to prevent voltage from being induced to a different phase. Only one cable 160 of the plurality of cables 160 may be installed in each slot 121a of each terminal block 121.

Each third fastening hole 120b may be formed in an inner face of each terminal block 121 to fix each cable 160 to each terminal block 121. Accordingly, when each second fastener 150 is inserted into each through-hole 161a of the terminal 161 of the cable 160 and each third fastening hole 120b and then rotated in the fastening direction, each cable 160 may be fixed to each slot 121a of the terminal block 121.

The terminal blocks 121 may be arranged in the horizontal direction and fastened to the casing 110. The terminal blocks 121 may be arranged such that lateral faces thereof are in contact with each other. Each first fastening hole 120a in a form of a semi-circular shape into which each first fastener 140 is inserted is formed on a contact face of each of the adjacent terminal blocks between the adjacent terminal blocks 121. When the lateral faces of the terminal blocks 121 are in contact with each other, the adjacent first fastening holes 120a may define a circular shape.

That is, the terminal blocks 121 may be fixed to the casing 110 while being coupled to each other using the first fasteners 140.

For example, when six terminal blocks 121 are provided as shown in FIGS. 5 to 6, the lateral faces of the pair of the terminal blocks 121 are arranged so as to be in contact with each other.

In this connection, the terminal blocks 121 may include AC three-phases terminals (R-phase terminal, S-phase terminal, T-phase terminal), DC 1 terminal (P(+) terminal), neutral terminal (N-phase terminal), and DC 2 terminal (P(−) terminal) in a right direction.

Then, a semi-circular first fastening hole 120a formed in one terminal block 121 and another semi-circular first fastening hole 120a formed in an adjacent terminal block 121 thereto are arranged to face each other.

Accordingly, a circular first fastening hole 120a is formed in a contact portion of the pair of terminal blocks 121. In this state, when each first fastener 140 is inserted into each first fastening hole 120a and the first fastener 140 is rotated in the fastening direction, the pair of terminal blocks 121 are fixed to the casing 110. In this manner, each of the remaining terminal blocks 121 as not yet fastened may be fixed to the casing 110.

The heat dissipation fan 130 is fixed to the front face of the casing 110 while being disposed below the input/output terminal unit 120. The heat generated by the inverter module is discharged out of the casing 110 through the heat dissipation holes 110a.

As described above, the inverter module includes various heating elements. Thus, the heat dissipation fan 130 is installed on the front face of the casing 110 to more efficiently discharge heat generated from the inverter module.

Thus, the heat dissipation fan 130 and the heat dissipation holes 110a face each other as the heat dissipation fan 130 is disposed on the front face of the casing 110 in an exposed manner to the outside. Accordingly, the heat dissipation fan 130 supplies external air to the casing 110 to the inverter module to induce heat dissipation of the inverter module and at the same time and to allow the heat generated from the inverter module to be discharged through the heat dissipation holes 110a.

In one example, the inverter device 100 may further include bus bars 170 coupled to the input/output terminal unit 120 using the second fasteners 150, as shown in FIG. 6.

Each bus bar 170 may include a first plate 171 facing the terminal of the cable 160 and having the second through-hole 171a formed therein, and a second plate 172 extending from a lower end of the first plate 171 toward the terminal 161 of the cable.

Accordingly, after each second fastener 150 is inserted into each second through-hole 171a of each bus bar 170, the through-hole 161a of the terminal of the cable 160, and the third fastening hole 120b, each second fastener 150 is rotated in the fastening direction. Thus, each bus bar 170 and each cable 160 may be fixed to the input/output terminal unit 120.

FIG. 7 is a perspective view of an inverter device 200 according to another embodiment of the present disclosure in FIG. 3. Differences from the present embodiment and the above-described embodiment will be mainly described.

As shown in FIG. 7, the inverter device 200 may further include a terminal cover 180 installed on the front face of the input/output terminal unit 120. Since the terminal cover 180 is installed on the front face of the input/output terminal unit 120, the open face of the input/output terminal unit 120 may be minimized to prevent the foreign matter or the like from adhering to the input/output terminal unit 120.

Therefore, it is possible to prevent accidental contact failure between the input/output terminal unit 120 and the cable 160 due to the foreign matter.

As described above, the inverter device 100 is configured such that the input/output terminal unit 120 and the heat dissipation fan 130 are disposed on the front face of the casing 110 in an exposed manner. Thus, the maintenance of the input/output terminal unit 120 and the heat dissipation fan 130 may be facilitated.

Further, since the heat dissipation fan 130 is arranged to face the heat dissipation holes 110a, the heat exchanged air with the inverter module and can be directly discharged to improve the heat dissipation efficiency.

Further, since the plurality of cables 160 are fixed to the input/output terminal unit 120 using the second fasteners 150, it is possible to prevent foreign matter from attaching to the terminals or to prevent detachment of the cable 160 from the input/output terminal unit 120 due to external force.

In addition, since the input/output terminal unit 120 is composed of the plurality of terminal blocks 121 which are fixed to the casing 110 using the first fasteners 140, the terminal blocks 121 may be prevented from be separated from the casing 110. Accordingly, when the first fasteners 140 are removed since the input/output terminal unit 120 is damaged, only the damaged terminal block 121 may be replaced, thereby reducing the replacement cost.

The present disclosure has been described with reference to the embodiments shown in the accompanying drawings. It will be understood by those skilled in the art that various changes and modifications may be made without departing from the scope of the present invention. Accordingly, a true scope of protection of the present disclosure should be determined only by the appended claims.

What is claimed is:

1. An inverter device having an inverter module for converting direct current (DC) power into alternate current (AC) power and supplying the AC power to a load, the device including:
    a casing housing the inverter module therein and having a plurality of heat dissipation holes defined in a rear face thereof;
    an input/output terminal unit fastened to a top of a front face of the casing using first fasteners, wherein a plurality of cables are electrically coupled to an inner face of the input/output terminal unit using second fasteners; and
    a heat dissipation fan disposed below the input/output terminal unit and fixed to the front face of the casing, wherein the fan discharges heat generated from the inverter module to an outside of the casing through the heat dissipation holes,
    wherein the input/output terminal unit is open at a front and a top thereof, wherein the input/output terminal unit includes a plurality of terminal blocks, each of the terminal blocks having a slot formed therein,
    wherein the terminal blocks are arranged horizontally and are individually fastened to the casing.

2. The inverter device of claim 1, wherein the terminal blocks are arranged so that lateral faces thereof are in contact with each other,
    wherein each first fastening hole is formed in a contact face of each of adjacent and contacting two terminal blocks, wherein each first fastening hole is formed in a semi-circular shape and receives each first fastener,
    wherein when the lateral faces of the adjacent two terminal blocks are in contact with each other, two first fastening holes of the adjacent two terminal blocks define a single full-circular shape.

3. The inverter device of claim 2, wherein an insulation member is installed in a lateral face of each terminal block.

4. The inverter device of claim 1, wherein the device further includes bus bars fixed to the input/output terminal unit using the second fasteners respectively.

5. The inverter device of claim 4, wherein a terminal is disposed at an end of each of the cables, and the terminal has a first through hole.

6. The inverter device of claim 5, wherein each of the bus bars includes a first plate facing the terminal of the cables and having a second through-hole formed therein, and a second plate extending from a lower end of the first plate toward the terminal of the cables.

7. The inverter device of claim 6, wherein each of the second fastener is configured to be inserted into each of the second through holes of the bus bars.

8. The inverter device of claim 1, wherein the device further includes a terminal cover disposed on the front face of the input/output terminal unit.

9. The inverter device of claim 1, wherein only one cable of the plurality of cables is installed in each slot of the terminal blocks.

10. The inverter device of claim 1, wherein the terminal blocks include at least one of AC three-phases terminals, a DC terminal, and a neutral terminal.

* * * * *